United States Patent
Watkinson

(10) Patent No.: US 6,271,737 B1
(45) Date of Patent: *Aug. 7, 2001

(54) COMMUNICATION DEVICE WITH FEEDBACK FOR CANCELLATION OF PERTURBATIONS

(75) Inventor: Stephen W. Watkinson, Ely (GB)

(73) Assignee: U.S. Philips Corporation, New York, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/282,326

(22) Filed: Mar. 31, 1999

(30) Foreign Application Priority Data

Apr. 2, 1998 (GB) .................................................. 9807052

(51) Int. Cl.⁷ ................................. H03B 1/00; H03B 5/00
(52) U.S. Cl. .......................... 331/183; 331/185; 331/186; 331/177 V; 455/260
(58) Field of Search ..................................... 331/175, 185, 331/186, 177 V, 117 R, 167, 117 FE, 74, 183; 455/255, 260, 265

(56) References Cited

U.S. PATENT DOCUMENTS

| | | | |
|---|---|---|---|
| 4,074,209 | * | 2/1978 | Lysobey .................................. 332/19 |
| 4,442,415 | * | 4/1984 | Ashida ................................... 331/16 |
| 5,101,178 | | 3/1992 | Komoda ............................... 331/158 |

* cited by examiner

*Primary Examiner*—Robert Pascal
*Assistant Examiner*—Kimberly E Glenn
(74) *Attorney, Agent, or Firm*—Jack D. Slobod

(57) ABSTRACT

A communications device, such as a one-way pager, comprises a receiver having a frequency down-conversion means for frequency converting an input signal using a local oscillator signal generated by a signal generating means, which may comprise a frequency synthesizer. The signal generating means (20) comprises a voltage controlled oscillator (VCO) (50) including an oscillator transistor (68) coupled to dc voltage source (54), frequency determining reactive elements coupled to the oscillator transistor (68) for determining the frequency to be generated, at least one of the reactive elements (80) being adjustable in response to an applied voltage and means (82,84) for phase modulating the oscillator transistor (68) in an opposite sense to that caused by voltage perturbations due to noise in the dc voltage supplied by the dc voltage source (54).

10 Claims, 2 Drawing Sheets

COMMUNICATION DEVICE WITH FEEDBACK FOR CANCELLATION OF PERTURBATIONS

BACKGROUND OF THE INVENTION

1. Field of the Invention

The present invention relates to a communications device, particularly but not exclusively, to controlling the frequency of a generating source in response to perturbations in the supply voltage due to significant levels of noise. The present invention also relates to a frequency generating circuit and to an integrated circuit including the frequency generating circuit.

2. Description of the Related Art

The communications device may be a one-way pager having a receiver stage including a local oscillator source or a two-way device such as a two-way pager, a cellular telephone and a cordless telephone equipped with a transceiver with a frequency generator for generating the local oscillator frequency for the receiver and the master oscillator frequency for the transmitter. These devices include continuously running circuits which introduce significant levels of noise on the dc supply voltage. This problem is particularly relevant for battery powered devices operating at voltages of the order of 1 volt.

U.S. Pat. No. 5,101,178 discloses a crystal oscillator for a battery powered portable telephone. In order to compensate for changes in frequency in response to changes in the dc source voltage, the source voltage is compared against a reference voltage and a control signal is produced on the basis of whether the source voltage is above or below the value of the reference voltage, a capacitor is added/not added to compensate or not for any change in oscillator frequency which is intended to be a fixed frequency. A drawback to this known circuit is that the frequency compensation is not continuous because the addition of, or disconnection of, the capacitor produces a step-like change in the oscillator frequency. Also it is not intended to deal with the effects of perturbations on the dc voltage source due to noise generated by other circuits within the device.

OBJECT AND SUMMARY OF THE INVENTION

An object of the present invention is to improve on the stability of an oscillator frequency in response to changes in dc source voltage.

According to one aspect of the present invention there is provided a communications device comprising frequency conversion means having a first input for a signal to be frequency converted and a second input for a converting signal generated by a frequency generating means, the frequency generating means comprising a voltage controlled oscillator (VCO) including an active element coupled to a dc voltage source, frequency determining reactive elements coupled to the active element for determining the frequency to be generated, at least one of the reactive elements being adjustable in response to an applied voltage and means for phase modulating the oscillator in an opposite sense to that caused by voltage perturbations in the dc voltage of the dc voltage source.

According to another aspect of the present invention there is provided a frequency generating circuit comprising a voltage controlled oscillator (VCO) including an active element coupled to a dc voltage source, frequency determining reactive elements coupled to the active element for determining the frequency to be generated, at least one of the reactive elements being adjustable in response to an applied voltage and means for phase modulating the oscillator in an opposite sense to that caused by voltage perturbations in the dc voltage of the dc voltage source.

According to a further aspect of the present invention there is provided an integrated circuit comprising the frequency generating circuit in accordance with the another aspect of the present invention.

By altering the reactance of the adjustable reactive element, for example a varactor diode, in the opposite sense to perturbations in the dc voltage source, the effects of noise on the active element are reduced if not cancelled.

In an embodiment of the present invention the phase modulating means comprises another adjustable reactive element to which the dc voltage is applied. More particularly a capacitance is coupled in series with the another adjustable reactive element. The means for applying the dc voltage comprises a rf blocking inductance coupled to a junction of the capacitance and the another adjustable reactive element.

A high impedance rf filter may be coupled in the dc path to the rf blocking inductance in order to match the phase modulation/modulating frequency characteristics of the dc supply feed to the another adjustable reactive element to the modulation caused by the active element.

The dc voltage may be derived from the dc voltage source or from a suitable point in the oscillator circuit.

The VCO may be embodied in a phase locked loop frequency synthesizer which has a loop filter for applying a control voltage to the adjustable reactive element.

BRIEF DESCRIPTION OF THE DRAWING

The present invention will now be described, by way of example, with reference to the accompanying drawings, wherein.

In the drawings the same reference numerals have been used to indicate corresponding features.

DETAILED DESCRIPTION OF THE PREFERRED EMBODIMENTS

Figure 1:
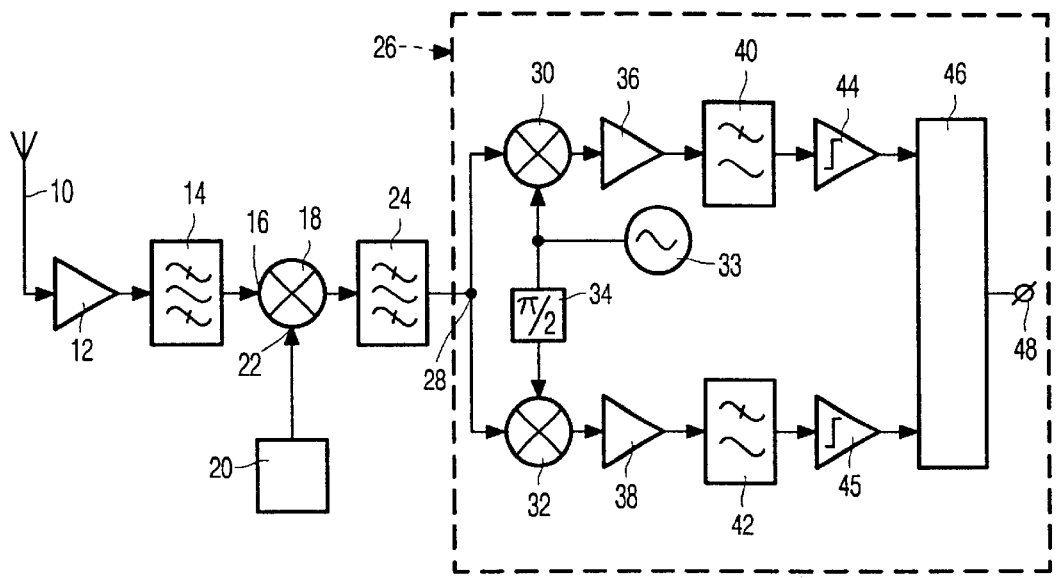
FIG. 1 is a block schematic diagram of a one-way pager.

Referring to FIG. 1, the receiver comprises an antenna 10 which is coupled by way of an RF amplifier 12 to a band pass filter 14 which selects the band of frequencies of interest. An output of the filter is coupled to a first input 16 of a mixer 18. A local oscillator signal from a local oscillator signal generator 20 is applied to a second input 22 of the mixer 18. The local oscillator signal generator 20 comprises a frequency synthesizer which will be described in greater detail with reference to FIGS. 2 and 3. The output from the mixer 18 is an IF signal which is filtered in a band pass or high pass filter 24 to provide a broad band signal which is applied to a zero IF frequency down conversion and demodulating stage 26. The output from the band pass filter 24 is applied to a junction 28 whereat the signal is split into two paths and applied to first inputs of mixers 30 and 32. An output of a local oscillator 33 is applied to a second input of the mixer 32 by way of a 90° phase shifter 34, and to a second input of the mixer 30. The local oscillator frequency applied to the mixers 30, 32 is such as to mix a wanted signal in the broad band IF signal from the band pass filter 24 down to a zero IF. The local oscillator 33 may comprise a crystal controlled oscillator or may comprise a submultiple of the frequency generated by the signal generator 20. Post mixer amplifiers 36, 38 are connected to the outputs of the mixers 30, 32, respectively. The outputs from the amplifiers 36, 38 are coupled to low pass filters 40, 42 which pass the wanted products of mixing. Limiting amplifiers 44, 45 are coupled to the outputs of the low pass filters 40, 42 respectively, and the outputs of the limiting amplifiers 44, 45 are coupled to a demodulator 46 which provides a data output on the terminal 48.

Figure 2:
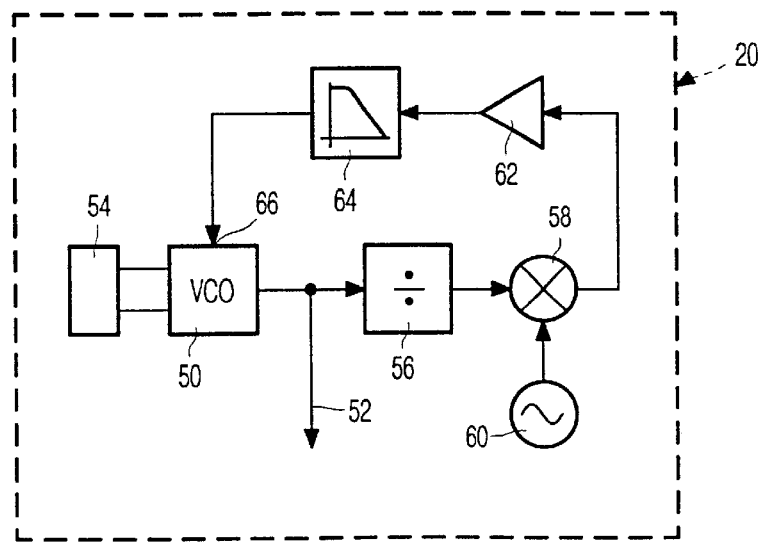
FIG. 2 is a block schematic diagram of a frequency synthesizer.

FIG. 2 shows a phase locked loop type of frequency synthesizer which comprises the local oscillator signal generator 20. The output local oscillator frequency on a terminal 52 is generated by a voltage controlled oscillator (VCO) 50 which is externally powered by a dc voltage source 54. The phase locked loop is of known design and consequently its construction will be described briefly. The VCO frequency is divided down to say of the order of 25 kHz in a divider 56 and the divided down frequency is applied to one input of a phase detector 58. A reference frequency of 25 kHz is generated by a crystal oscillator 60 and is applied to a second input of the phase detector 58. An output of the phase detector 58 comprises a phase error or difference signal representing the difference in phase of the signals applied to the first and second inputs. The phase error signal is amplified in an amplifier 62 and applied to a loop filter 64 which supplies a control signal to an input 66 of the VCO 50 for adjusting the local oscillator frequency.

In a non-illustrated receiver, the zero IF stage 26 is replaced by another superhet stage and a crystal controlled oscillator is used to generate the local oscillator frequency of this stage. The crystal controlled oscillator may be used to provide the reference frequency for the frequency synthesizer 20 in place of the oscillator 60 in FIG. 2.

Figure 3:
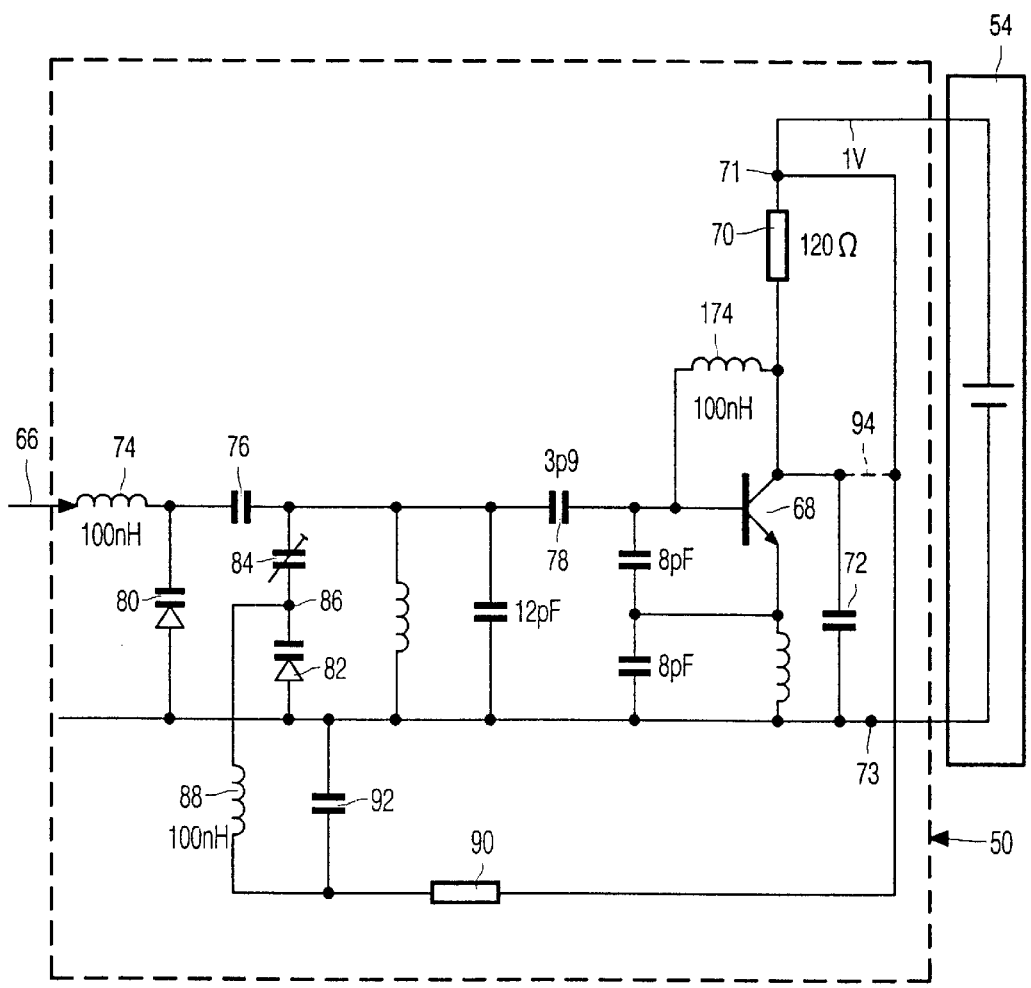
FIG. 3 is a schematic circuit diagram of an embodiment of VCO circuit.

Referring to FIG. 3 the VCO 50 comprises an NPN junction transistor 68 having emitter, base and collector electrodes. The collector electrode is connected to one terminal 71 of the dc voltage source 54 by way of a 120 ohm resistor 70 and is also decoupled by a 1 nF capacitor 72 to a second terminal 73 of the dc voltage source 54. A 100 nH choke 174 interconnects the collector and base electrodes. Various inductive and capacitive elements are interconnected between the base and emitter electrodes and the second power supply terminal 73, however only those which are relevant to the understanding of the present invention will be individually referenced. The input 66 is coupled by a 100 nH choke 74 and series connected capacitors 76, 78 to the base electrode of the transistor 68. A varactor 80 is coupled between a junction of the choke 74 and the capacitor 76 and the second power supply terminal 73. The capacitance value of the varactor 80 is altered in response to changes in the control signal on the input 66 and thereby changes the output frequency on the terminal 52 (FIG. 2).

A problem which is present when designing electronic equipment incorporating a VCO is to achieve the required phase noise specification when the dc voltage supply has added noise due to other parts of the apparatus circuitry generating significant levels of noise on the dc supply lines as represented by the terminals 71, 73 in FIG. 3. Phase modulation is caused by parameters of the oscillator semiconductor device, that is the transistor 68, being modulated as a consequence of the dc supply voltage fluctuations.

In accordance with the present invention the signal generator 50 is constructed to reduce significantly VCO phase noise caused by supply voltage perturbations by phase modulating the oscillator in the opposite sense.

In a first embodiment a second varactor 82 and a variable capacitor 84 are coupled in series between the power supply line 73 and a junction of the capacitors 76, 78. A junction 86 of the second varactor 82 and the variable capacitor 84 is coupled by way of a rf blocking inductor 88 to the dc voltage terminal 71. A simple RC filter is provided by series resistance 90 in the line coupling the inductance 88 to the terminal 71 and a shunt capacitor 92.

In operation the dc supply voltage is supplied by way of the inductance 88 to the varactor 82 which phase modulates the oscillator in the opposite sense to the modulation or phase noise caused by the transistor 68. Suitably adjusting the variable capacitor 84 can ensure that the phase modulation due to the varactor 82 leads to substantial cancellation of the phase noise. The simple high impedance RC filter formed by the resistance 90 and the capacitor 92 matches the phase modulation/modulating frequency characteristics of the supply feed to the varactor 82 to the phase modulating effect of the transistor 68.

In a variant of the circuit shown in FIG. 3, since the collector bias resistor 70 is decoupled by the capacitor 72, then the dc feed voltage can be taken from the collector electrode of the transistor 68 as shown in broken lines 94.

In another non-illustrated variant, the second varactor 82 and the variable capacitor 84 together with the dc feed components are omitted and the dc supply noise is added to the loop error signal applied to the input 66. One way of adding the dc supply noise is to return capacitors in the loop filter 64 (FIG. 2) to the dc supply terminal 71 rather than to ground. However care is required in adjusting the network to provide phase noise cancellation without changing the required VCO frequency control slope and/or generating further noise by having additional components.

Although the present invention has been described with reference to a radio receiver, the invention is applicable to any apparatus having a VCO for generating master oscillator frequencies as well as local oscillator frequencies, such as a two-way pager and cellular and cordless telephones.

Although the phase modulation has been described as being applied using a varactor, any suitable variable capacitance diode or other device can be used.

From reading the present disclosure, other modifications will be apparent to persons skilled in the art. Such modifications may involve other features which are already known in the design, manufacture and use of communication devices and component parts thereof and which may be used instead of or in addition to features already described herein.

What is claimed is:

1. A communications device comprising frequency conversion means having a first input for a signal to be frequency converted and a second input for a converting signal generated by a frequency generating means, the frequency generating means comprising a voltage controlled oscillator (VCO) including an active element having a control electrode, a current supply electrode and an output electrode, a dc voltage source coupled between the current supply electrode and the output electrode, frequency determining reactive elements coupled to the active element for determining the frequency to be generated, at least one of the reactive elements being adjustable in response to an applied voltage and means for deriving a dc signal from the dc voltage of the dc voltage source which signal includes at least a component responsive to voltage perturbations in said dc voltage, and means for phase modulating the VCO in response to said dc signal in an opposite sense to a phase modulation caused by modulation of parameters of the active element due to said voltage perturbations.

2. A communications device as claimed in claim 1, wherein the phase modulating means comprises another adjustable reactive element and means for applying said dc signal to the another adjustable reactive element.

3. A communications device as claimed in claim 2, wherein a variable capacitance is coupled in series with the another adjustable reactive element and the means for applying said dc signal comprises a rf blocking inductance coupled to a junction of the variable capacitance and the another adjustable reactive element.

4. A communications device as claimed in claim 1, wherein the means for deriving said dc signal comprises a RC filter.

5. A communications device as claimed in claim 2, wherein the active element comprises a semiconductor device and the output electrode of the active device is coupled by a resistive device to the dc voltage source, a decoupling capacitance being coupled to a junction of the output electrode and the resistive device, and the dc signal for phase modulating the VCO being derived from said junction.

6. A communications device as claimed in claim 5, wherein the another adjustable reactive element comprises a variable capacitance diode.

7. A communications device comprising frequency conversion means having a first input for a signal to be frequency converted and a second input for a converting signal generated by a frequency generating means, the frequency generating means comprising a voltage controlled oscillator (VCO) including an active element having a control electrode, a current supply electrode and an output electrode, a dc voltage source coupled between the current supply electrode and the output electrode, frequency determining reactive elements coupled to the active element for determining the frequency to be generated, at least one of the reactive elements being adjustable in response to an applied voltage and means for phase modulating the VCO in an opposite sense to a phase modulation caused by the active element due to voltage perturbations in the dc voltage of the dc voltage source, wherein the VCO is part of a phase locked loop frequency synthesizer having a loop filter for applying a control voltage to the adjustable reactive element and the voltage perturbations are added to the control voltage.

8. A frequency generating circuit comprising a voltage controlled oscillator (VCO) wherein an output of the VCO is applied to a frequency conversion means, the VCO includes an active element having a control electrode and an output electrode, a dc voltage source coupled between the current supply electrode and the output electrode, frequency determining reactive elements coupled to the active element for determining the frequency to be generated, at least one of the reactive elements being adjustable in response to an applied voltage and means for deriving a dc signal from the dc voltage of the dc voltage source which signal includes at least a component responsive to voltage perturbations in said dc voltage, and means for phase modulating the VCO in response to said dc signal in an opposite sense to a phase modulation caused by modulation of parameters of the active element due to said voltage perturbations.

9. A frequency generating circuit as claimed in claim 8, wherein the phase modulating means comprises another adjustable reactive element and means for applying said dc signal to the another adjustable reactive element.

10. A frequency generating circuit as claimed in claim 8, embodied in an integrated circuit.

* * * * *